United States Patent [19]
Machida

[11] Patent Number: 5,457,788
[45] Date of Patent: Oct. 10, 1995

[54] ASSOCIATIVE MEMORY SYSTEM FOR PERFORMING HIT JUDGMENT ON CACHE DATA

[75] Inventor: Hirohisa Machida, Hyogo, Japan

[73] Assignee: Mitsubishi Denki Kabushiki Kaisha, Tokyo, Japan

[21] Appl. No.: 992,281

[22] Filed: Dec. 16, 1992

[30] Foreign Application Priority Data

Jan. 20, 1992 [JP] Japan .................................. 4-028985

[51] Int. Cl.⁶ .................................................. G06F 12/02
[52] U.S. Cl. ................................ 395/435; 364/DIG. 1; 364/253.1; 395/413; 365/49
[58] Field of Search ........................... 364/200 MS File, 364/900 MS File; 395/400, 425; 365/49

[56] References Cited

U.S. PATENT DOCUMENTS

| | | | |
|---|---|---|---|
| 5,133,058 | 7/1992 | Jensen | 395/400 |
| 5,173,872 | 12/1992 | Crawford et al. | 365/49 |
| 5,182,799 | 1/1993 | Tamura et al. | 395/400 |
| 5,249,276 | 9/1993 | Honmura et al. | 395/400 |

OTHER PUBLICATIONS

"2.6 Gbyte/sec Bandwidth Cache/TLB Macro for High–Performance RISK Processor," IEEEE 1991 Custom Integrated Circuits Conference, pp. 10.2.1 to 10.2.4, May 12–15, 1991, Toshinari Takayanagi, et al.

"An In–Cache Address Translation Mechanism," 13th Annual International Symposium on Computer Architecture, Jun. 2–5, 1986, David A. Wood, et al.

Primary Examiner—Rebecca L. Rudolph
Assistant Examiner—Hiep T. Nguyen
Attorney, Agent, or Firm—Townsend and Townsend Khourie and Crew

[57] ABSTRACT

An associative memory system using an associative memory circuit, capable of performing hit judgment on cache data at a high speed. The associative memory system comprises a virtual-address holding CAM circuit 2 for outputting a hit signal 5 when the data previously stored in a supplied address coincides with a supplied virtual address 4, a cache-tag memory circuit 1 for outputting cache-tag data coinciding with the supplied virtual address 4 when the data is present, and a physical-address holding CAM circuit 3 which connects with an output line for outputting the hit signal 5 given from the CAM circuit 2 and outputs the hit signal 6 when a physical address previously stored in the memory area from which the hit signal is outputted coincides with cache tag data supplied from the cache-tag memory circuit 1.

8 Claims, 12 Drawing Sheets

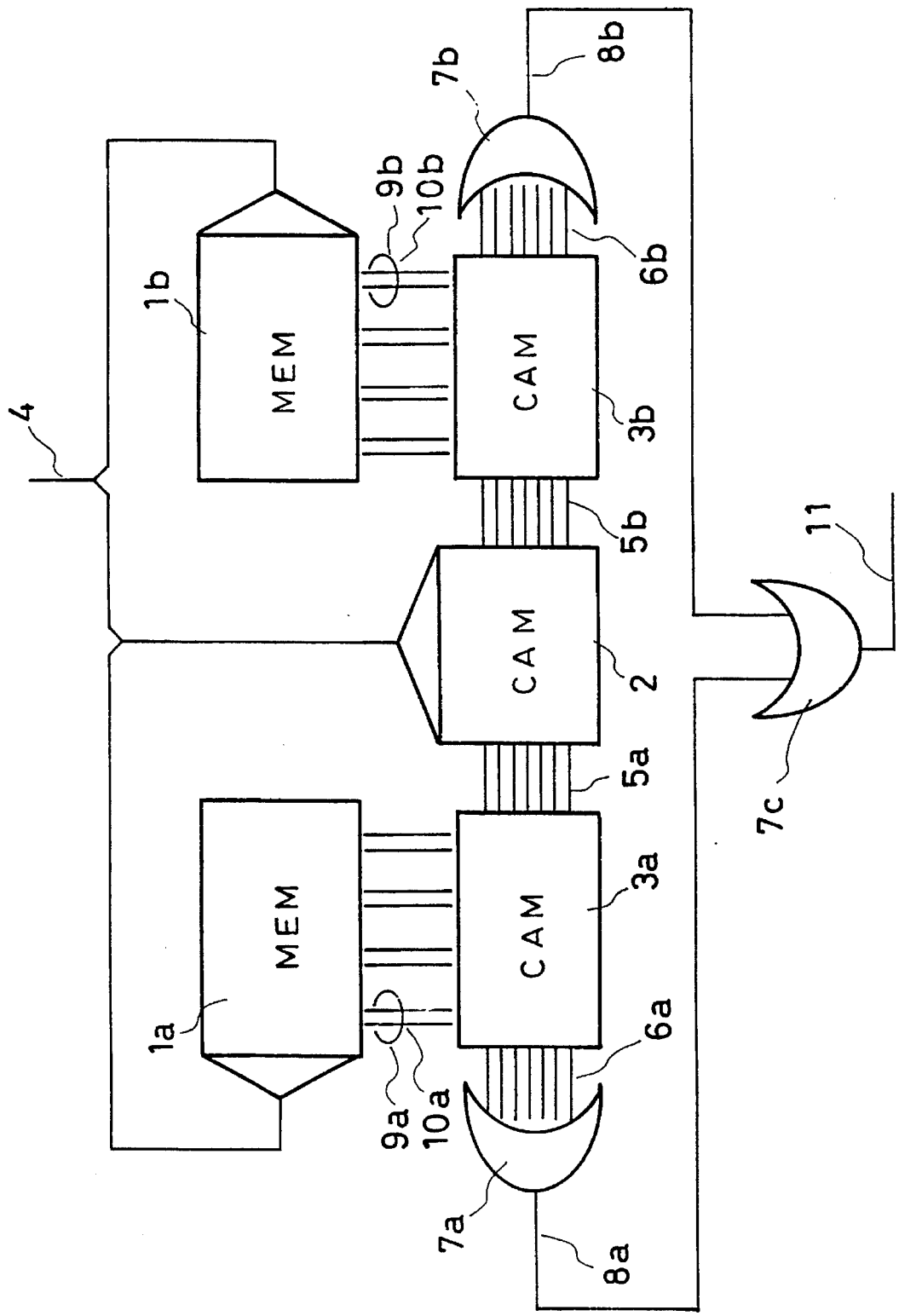

5,457,788

ASSOCIATIVE MEMORY SYSTEM FOR PERFORMING HIT JUDGMENT ON CACHE DATA

BACKGROUND OF THE INVENTION

1. Field of the Invention

The present invention relates to an associative memory system to be mounted on a processor or to constitute peripheral circuits of the processor.

2. Description of the Prior Art

For a system using a microprocessor, the address space to be actually used is limited by the physical number of memory cells to be mounted. The limited address space outside the microprocessor is called a physical address space and the address is called a physical address. However, because the address space is not physically limited inside the microprocessor, various processings are executed by assuming that addresses equal to or more than the actual address space are present. The address space inside the microprocessor is called a virtual address space and the address is called a virtual address.

Therefore, when a microprocessor uses an outside memory space, it has to convert the virtual address in the microprocessor into a physical address. The circuit used for the conversion is called a translate look aside buffer circuit (hereafter referred to as a TLB circuit). The TLB circuit is first described below.

FIG. 8 shows a block diagram of the TLB circuit. In FIG. 8, numeral 2 is a memory circuit called a content addressable memory circuit (hereafter referred to as a CAM circuit), 71 is a normal memory circuit, 72 is an address signal of the CAM circuit, 5 is a hit signal (output line) outputted from the CAM circuit 2, 4 is a virtual address, and 65 is a physical address. Though the memory circuit 71 performs the completely same operation as the normal memory circuit, the word selection signal of the normal memory circuit is connected with the hit signal 5 outputted from the CAM circuit 2. Therefore, the memory circuit 71 does not need to generate the word selection signal with a decoder circuit unlike the normal memory circuit or does not have the decoder circuit.

The circuit called CAM circuit has a function for checking if the stored data coincides with external data in addition to the function for storing or reading data from the outside line the normal memory circuit, which is a type of the memory circuit called associative memory. When the CAM circuit stores the data coinciding with external data, it has a function for outputting a signal called hit signal and notifying the outside in which word the data coinciding with external data is stored.

FIG. 9 is an internal block diagram for explaining the CAM circuit 2. In FIG. 9, numeral 41 is a CAM cell circuit constituting the CAM circuit, 31 is supply potential, 35 is a word selection signal, 81 is a decoder circuit, and 82 is a data read/write circuit. FIG. 3 is an internal block diagram explaining the CAM cell circuit in detail. Numeral 31 is supply potential, 32a and 32b are resistances, 33a to 33h are n-channel transistors, 34 is earth potential, 35 is a word selection signal, 36 is a coincidence signal, 37 is a bit line of external data to be compared, 39 is a bit line of stored data, and 40 is a bit line of reverse data of stored data. The CAM cell circuit 41 can store data because it is a memory circuit. In FIG. 3, numeral 390 is a stored data value, 400 is a reverse data value of stored data. The coincidence signal 36 comes to the supply potential when the data 390 in the CAM cell circuit 41 coincides with the external-data bit line data 37. In FIG. 9, the horizontal direction is assumed as the bit direction and the vertical direction is assumed as the word direction. The coincidence signal 36 in FIG. 3 equals the hit signal 5 of the CAM circuit 2 in FIG. 8.

The operation for the CAM circuit 2 to store data is the same as that of the normal memory circuit. To store the data in the CAM cell circuit 41 of the CAM circuit 2, the data in the bit lines 39 and 40 is stored in a circuit comprising the n-channel transistors 33c and 33d and the resistances 32a and 32b through the n-channel transistors 33a and 33b selected by the word selection signal 35. That is, the data in the bit line 39 is written the data value 390 and the data in the bit line 40 is written the data value 400. To read the data in the CAM cell circuit 41 of the CAM circuit 2 to the outside, the data in the data values 390 and 400 is transferred to the bit lines 39 and 40 through the n-channel transistors 33a and 33b selected by the word selection signal 35 and read to the outside from the data read/write circuit 82. These operations are controlled and executed by the decoder circuit 81 and data read/write circuit 82. This is the same as the normal memory circuit.

Then, the operation for the CAM circuit 2 to compare data is described below. To simplify the description, it is assumed that the supply potential indicates the logical value "1" and the earth potential indicates the logical value "0". When the circuit is connected to both the supply potential and earth potential, it is assumed that the logical value indicates "0". The coincidence signal 36 normally has the logical value "1" because it is connected to the supply potential 31 as shown in FIG. 9.

When it is assumed that the data "1" is stored in the CAM cell circuit 41, the data value 390 in FIG. 3 is "1" (therefore, the reverse data value 400 is "0"). When the external data to be compared is "1", the bit line 37 of external data is set to "1" (the reverse bit line 38 of external data is set to "0"). In this case, the n-channel transistors 33e and 33h in pairs of the n-channel transistors 33e and 33g on one hand and 33f and 33h on the other are turned off and the coincidence signal 36 is connected with the supply potential 31 which is not connected with the earth potential 34. When the data "0" is stored in the CAM cell circuit 41 and the data to be compared is "0", the coincidence signal 36 is connected with the supply potential 31 which is not connected with the earth potential 34. In FIG. 9, when every bit-directional CAM cell circuit 41 is equal to the external data to be compared of each bit, the hit signal 5 (equal to the coincidence signal 36) has the logical value "1" because it is not connected with the earth potential 34 as described above. That is, because the data coinciding with external data as the result of comparison is present in the CAM circuit 2, the hit signal 5 showing that data is present has the logical value "1".

On the contrary, even if one bit having unequal data is present in the bit-directional CAM cell circuits, the both n-channel transistors of either of pairs of the n-channel transistors 33e and 33g on one hand and 33f and 33h on the other are turned on in the CAM cell circuits 41. Therefore, the coincidence signal 35 is connected with both the earth potential 34 and the supply potential 31 in the CAM cell circuits 41. In this case, the hit signal 5 in FIG. 8 has the logical value "0" as defined. As the result of comparing the data stored in any word with external data, the hit signal 5 of the word indicates the data "1" if they are equal to each other but it indicates the data "0" if they are not equal. Because different data is stored in each word in the CAM circuit 2, only any one of bit signals 5 is set to "1" or all bit signals 5 are set to "0". However, no hit signal 5 is set to "1" in two or more words.

The operation of the TLB circuit is described below by referring to FIG. 8 according to the above mentioned. <1> In FIG. 8, the data in the virtual address 4 is stored in any word of the CAN circuit 2 and the physical address to be converted is stored in equal words in the memory circuit 71. <2> It is checked if data coinciding with the data in the virtual address 4 given from the outside is present in each word of the CAM circuit 2. <3> If coincident data is present in the CAM circuit 2, the hit signal 5 of the coincident word comes to "1". <4> Because the hit signal 5 is connected to the word selection line of the memory circuit 71, the physical address stored in the word in the memory circuit 71 is read and virtual-to-physical address conversion is completed when the hit signal 5 comes to "1". <5> Unless any coincident data is present in the above Item <3>, no physical address is read from the memory circuit 71 because no hit signal 5 comes to "1". The above mentioned is the address conversion method by the TLB circuit. However, the operation by the TLB circuit is normally slow because the operation of the CAM circuit 2 is slow.

Recent systems using a microprocessor normally use a memory having a structure of two or more hierarchies. In general, a memory cell to be directly accessed by a microprocessor comprises a semiconductor cell. In this case, a large-capacity low-speed dynamic RAM (hereafter referred to as DRAM) and a small-capacity high-speed static RAM (hereafter referred to as SRAM) are used. FIG. 10 shows a normal system constitution. In FIG. 10, numeral 51 is a microprocessor, 52 is an SRAM circuit, 53 is a DRAM circuit, 54 is an address, 55 is data, and 56 is a comparison circuit.

Data required by the microprocessor 51 is normally stored in the DRAM circuit 53 with a large capacity and some pieces of the data frequently used is stored in the SRAM circuit 52 capable of executing high-speed operation. The microprocessor 51 frequently uses the data stored in the SRAM circuit 52. It uses the data stored in the DRAM circuit 53 at a low speed only when using data not stored in the SRAM circuit 52. With the above constitution, the system operates at a high speed as if it uses a large-capacity high-speed memory cell. In this case, the SRAM circuit 52 is called cache memory and the DRAM circuit 53 is called main memory.

A cache memory comprises two SRAM circuits in order to judge whether or not necessary data is present in the cache memory. The two circuits are the SRAM circuit 52a for data and the SRAM circuit 52b for tag as shown in FIG. 10. The SRAM circuit 52a stores the data to be processed by the microprocessor 51 in its main memory similarly to the normal memory circuit. The SRAM circuit 52b for tag stores the high-order bits of an address. For example, if the address is expressed by 32-bit data, some bits starting with the highest order are stored in the SRAM circuit 52b for tag as a tag when the cache is assessed by low-order 16 bits.

The fact that necessary data is present in the cache is called "to hit the cache". For example, when it is found that the tag data read from the SRAM circuit 52b for tag by the address data of low-order 16 bits coincides the address data of its own high-order bits as the result of comparison by the comparison circuit 56, the comparison result represents that necessary data is present in the cache. If the former does not coincide with the latter, the comparison result represents that no necessary data is present in the cache. In this case, it is necessary to read data from the main memory. It is possible to use the abovementioned CAM circuit for the hit judgment of the cache tag. However, the CAM circuit is not used because it has a very large capacity compared with the TLB circuit and its operation is very slow.

As described above, the TLB circuit and cache memory circuit are essential for the memory control system of the systems using a microprocessor. The cache memory and main memory are normally accessed with a physical address because they are set outside the microprocessor. The memory control system using the TLB circuit is described below. FIG. 11 shows the constitution of a normal memory control system using a TLB circuit. In FIG. 11, numeral 51 is a microprocessor, 61 is a TLB circuit, 52 is a cache memory, 63 is a main memory, 61 is a virtual address, 65 is a physical address, and 66 is data.

Because the operation of the TLB circuit 61 is very slow as described above, the constitution in FIG. 11 has a problem. That is, though the cache memory 62 is used in addition to the main memory 63 to access memory data from the microprocessor 51 at a high speed in the system, it is necessary to access the low-speed TLB circuit 61 before accessing the cache memory 62.

Therefore, the method shown in FIG. 12 is frequently used to avoid the delay in the TLB circuit. In FIG. 12, numeral 8 is a hit signal, 51 is a microprocessor, 55 is a comparison circuit, 61 is a TLB circuit, 62a is a memory for cache data, 62b is cache tag, 4 is a virtual address, and 65a and 65b are physical addresses. No physical address is connected to the cache memory 62 but the virtual address 4 outputted from the microprocessor 51 is connected to it. Therefore, a physical address converted from the virtual address is stored in the cache tag 62b by using the virtual address as an address value. For FIG. 11, a physical address has been stored in the cache tag 62b by using the physical address as an address value.

The operation is described below. The TLB circuit 61 converts a virtual address into a physical address as usual and the physical address 65a read out of the cache tag with a virtual address by the cache memory is compared with the physical address 65b outputted by the TLB circuit 61. When two pieces of data coincide with each other, the hit signal 8 is set to "1". This shows that the physical address has been present in the TLB circuit 61 and necessary data is present in the cache memory 62.

The above mentioned is brief description of the memory control system. Details are disclosed in the following theses. "2.6 Gbyte/sec bandwidth Cache/TLB Macro for High-Performance RISC Processor" (IEEE CICC 91 pp. 10.2.1–10.2.4) "An In-Cache Address Translation Mechanism" (The 13th Annual International Symposium on Computer Architecture pp. 358–365)

As described above, the existing associative memory system takes time in generating the hit signal because it separately reads the data in the TLB circuit and the data in the cache tag before comparing these pieces of data with the comparison circuit to judge the hit of the cache memory.

SUMMARY OF THE INVENTION

The present invention is made to solve the above problem and, its object is to provide an associative memory system capable of executing hit judgment on cache data at a high speed.

The associative memory system of the present invention comprises a first associative memory circuit (CAM circuit 2) which outputs a first signal (hit signal 5) or notifying that the data previously stored in an supplied address 72 to specify a memory area coincides with a supplied virtual address 4, a cache memory (cache tag memory circuit 1) which outputs the data (cache tag data) coinciding with the virtual address, and a second associative memory circuit (CAM circuit 3) which connects with an output line (hit signal 5 output line) for outputting the first signal supplied from the first associative circuit and outputs a second signal (hit signal 6) for notifying that a physical address previously stored in the memory area to which the first signal is outputted coincides with the data supplied from the cache memory.

Moreover, another associative memory system of the present invention is constituted so that each of the cache memory and associative memory circuit has a memory cell (CAM cell circuit 4A) for storing data 390 and its reverse data 400, a common bit line 391 shared by a bit line 39 for writing data in or reading data from the memory cell and an external data bit line 37 for supplying external data to the memory cell, and a common reverse bit line 401 shared by a reverse bit line 40 of the bit line 39 and a reverse bit line 38 of the external data bit line 37, and the common bit lines of the cache memory and second associative memory circuit and the reverse common bit lines of them are respectively connected with each other.

It is possible to make the first associative memory circuit 2 and the second associative memory circuit 3 perform conversion as parallel processing.

The cache memory is connected with the second associative memory circuit through the common bit line 391 and the reverse bit line 401.

The above and other objects, features, and advantages of the invention will become more apparent from the following description when taken in conjunction with the accompanying drawings.

BRIEF DESCRIPTION OF THE DRAWINGS

FIG. 2(*b*) is a diagram explaining the cache tag memory circuit of the associative memory system of the present invention;

FIG. 5(*b*) is a diagram showing the time lag necessary for hit judgment on cache data in an embodiment according to the prior art;

FIG. 6 is a block diagram of the associative memory system of another embodiment of the present invention;

DESCRIPTION OF THE PREFERRED EMBODIMENT

EMBODIMENT 1

Figure 1:
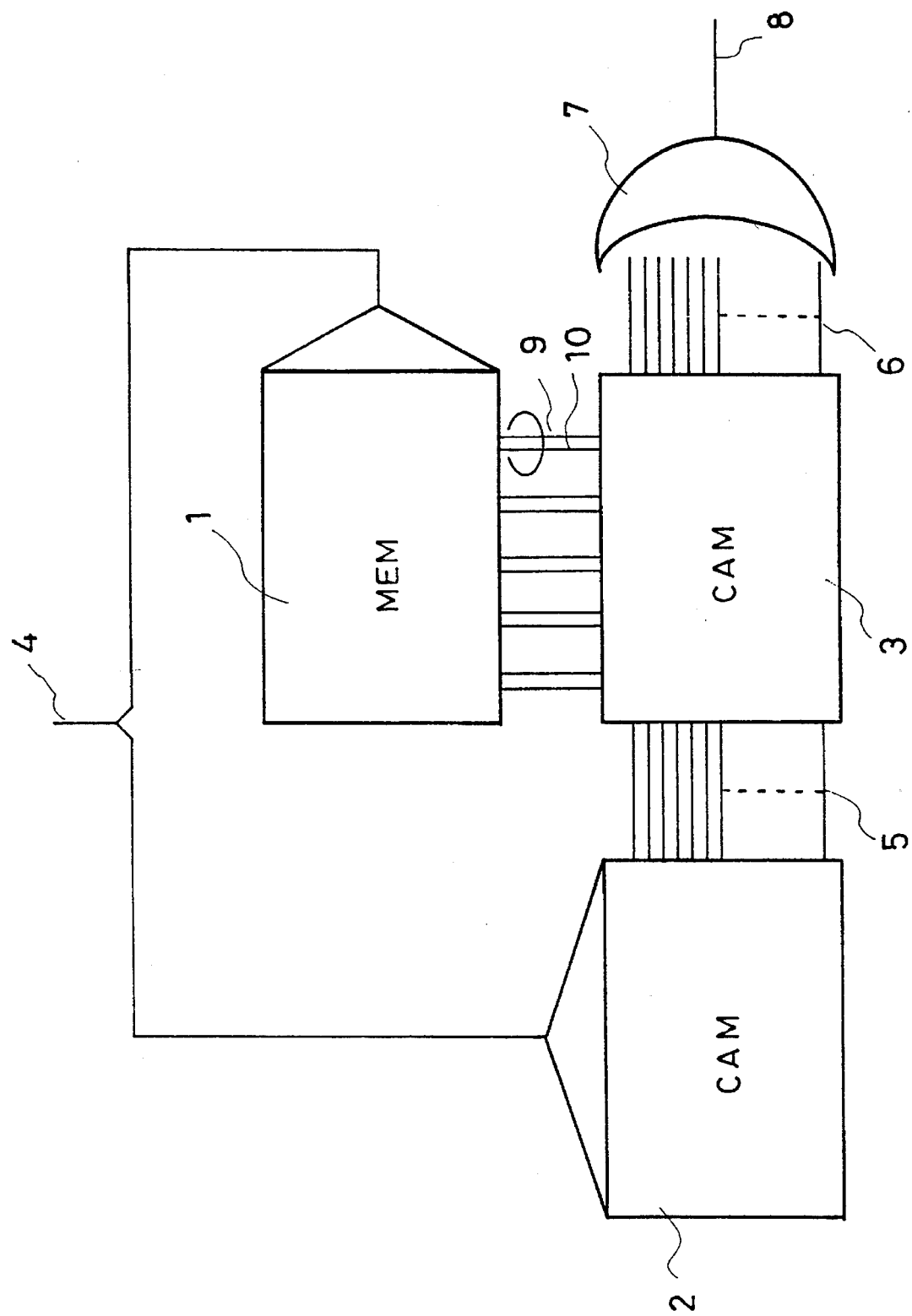
FIG. 1 is a block diagram of the associative memory system according to the present invention.

An embodiment of the present invention is described below. FIG. 1 is a block diagram of the memory control system using the associative memory system of the present invention. In FIG. 1, numeral 1 is a memory circuit for cache tag, 2 is a CAM circuit (first associative memory circuit) for holding virtual addresses of a TLB circuit, 3 is a CAM circuit (second associative memory circuit) for holding physical addresses, 4 is a virtual address (data line), 5 is a hit signal (output line) (first signal) for the virtual address 4, 5 is a hit signal (second signal) for checking if a physical address coincides with a cache tag, 7 is an OR circuit for detecting that the hit signal 6 is supplied to any one of word lines, 8 is a final hit signal indicating a virtual address is entered in a cache, and 9 and 10 are cache-tag data bit lines. The signal of the bit line 10 is a reverse signal of the bit line 9, that is, these signals are reverse to each other.

Figure 2:
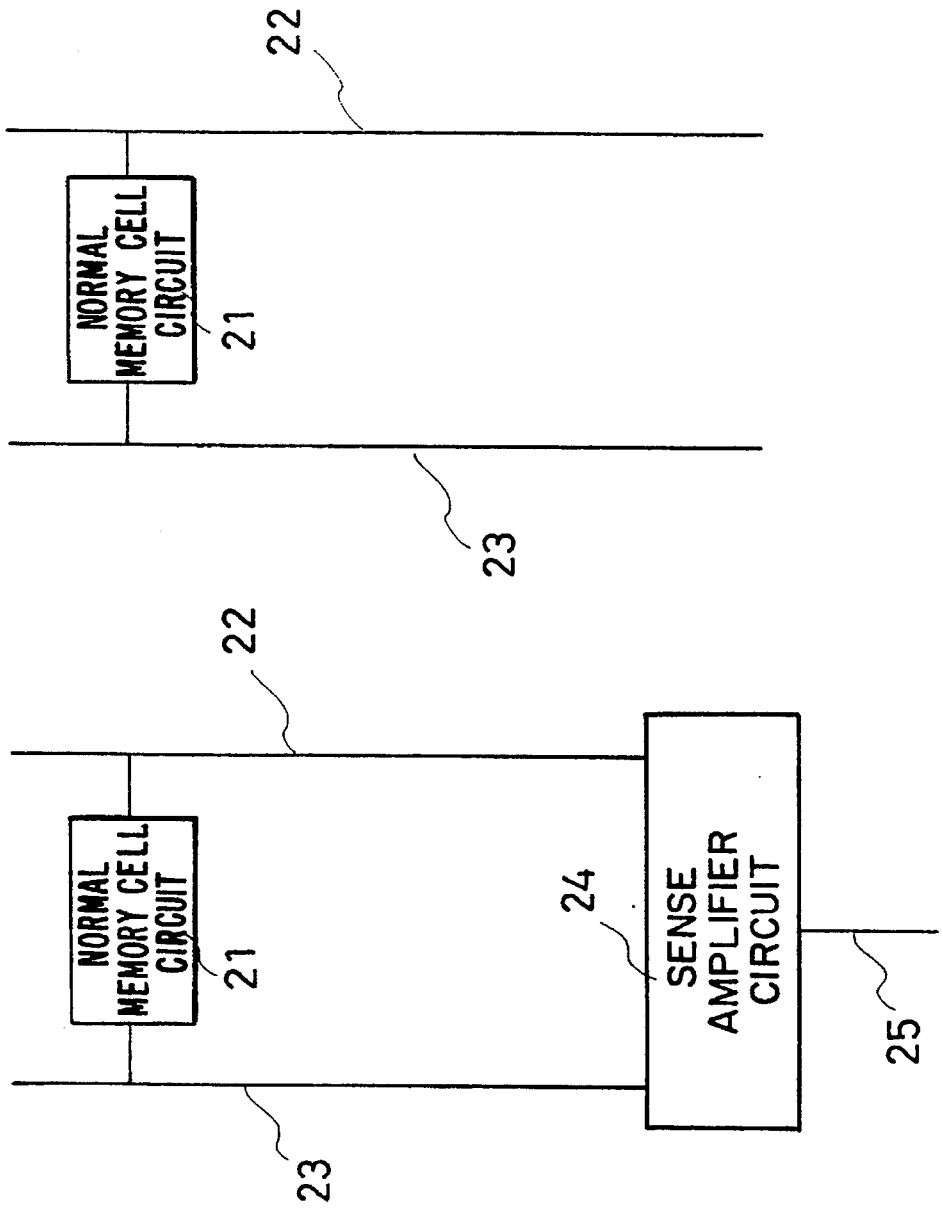
FIG. 2(*a*) is a diagram explaining the memory circuit according to prior art.

The constitution of the cache tag memory circuit 1 is the same as that of normal memory circuit except the fact that the bit line 9 signal and reverse bit line 10 signal in the memory cell are directly outputted to the outside of the memory circuit 1. FIGS. 2(*a*) and 2(*b*) characteristically show different portions between the memory circuit 1 and an existing memory circuit. FIG. 2(*a*) shows the constitution of the existing memory circuit and FIG. 2 (*b*) shows the constitution of the memory circuit 1. In FIGS. 2(*a*) and 2(*b*) numeral 21 is a normal memory cell circuit, 22 is a bit-line signal line, 23 is a bit-line reverse signal line, 24 is a sense amplifier circuit, and 25 is a data line. For the normal memory circuit, the data signal 25 is generated by the bit-line signal line 22 and bit-line reverse signal line 23 by the sense amplifier circuit 24 and outputted to an external circuit. For the present invention, however, propagation of data is not delayed by the sense amplifier because the signals of the bit-line signal line 22 and the bit-line reverse signal line 23 are outputted to the outside without using the sense amplifier 24.

Figure 3:
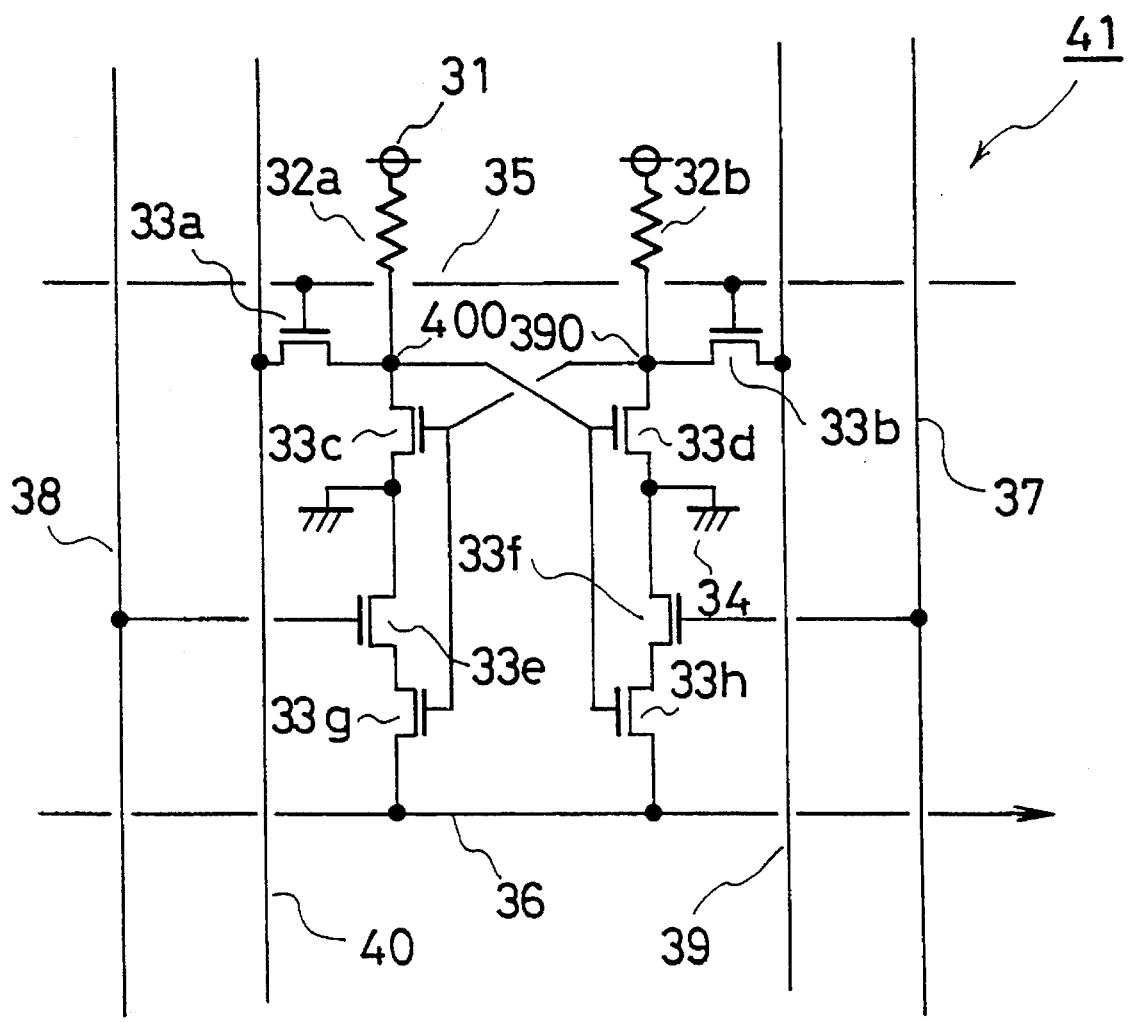
FIG. 3 is an internal detailed block diagram of a CAM circuit.
Figure 4:
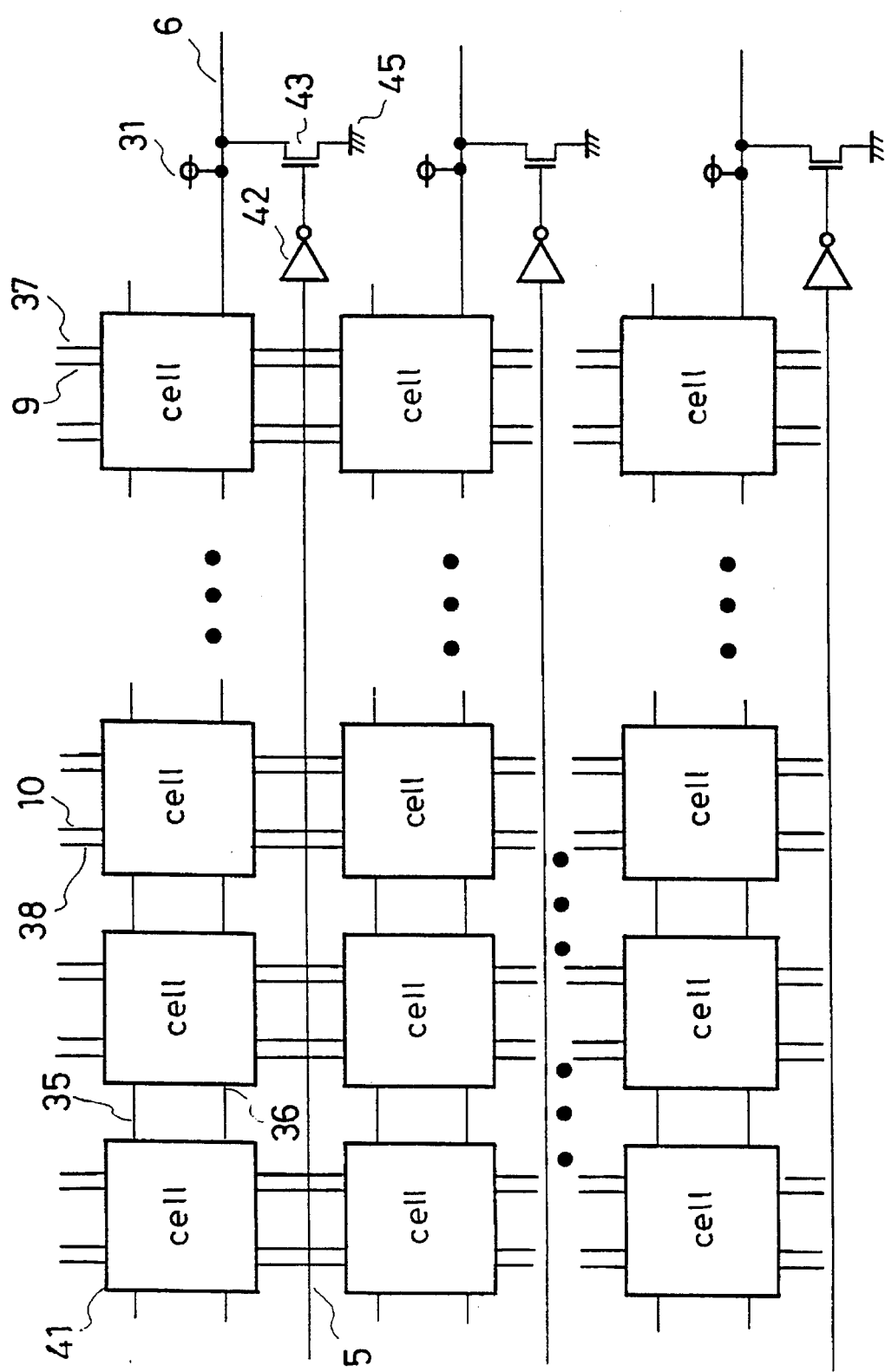
FIG. 4 is a block diagram of the physical-address holding CAM circuit of the present invention.

FIGS. 3 and 4 are block diagrams explaining the physical-address holding CAM circuit 3 of the present invention in detail. The physical-address holding CAM circuit 3 is constituted only by connecting the memory cell circuits of the existing CAM circuit by the necessary number of bits and necessary number of words in the two-dimensional direction and adding a simple circuit as shown in FIG. 4. In FIG. 4, numeral 41 is a CAM cell circuit as a memory cell, 42 is an inverter circuit, 43 is an n-channel transistor, 31 is supply potential, and 45 is earth potential. Numeral 5 is a hit signal of the virtual address CAM circuit 2 in FIG. 1. Numerals 9 and 10 are a bit and reverse-bit lines in FIG. 1, which correspond to the bit lines 39 and 40 in FIG. 3.

The memory cell circuit of the physical-address holding CAM circuit 3 can use that of the existing CAM circuit. For the memory cell circuit 41 of the physical-address holding CAM circuit 3 of the present invention, however, the data bit lines 9 and 10 of the cache tag shown in FIG. 1 are connected to the bit lines 39 and 40 for comparison. Also in FIG. 4, the horizontal direction is assumed as the bit direction and the vertical direction is assumed as the word direction.

For the TLB circuit according to the prior art, the hit signal 5 of the virtual address CAM circuit 2 is connected to the word selection signal of the physical-address holding MEM circuit according to the prior art. For the present invention, however, the hit signal 5 is connected to the n-channel transistor 43 to generate a signal for checking if a physical address coincides with a cache tag through the inverter circuit 42. Therefore, the word selection signal 35 of the physical-address holding memory cell circuit 41 of the present invention can be connected with the output of an address decoder circuit used for a normal memory circuit. Thus, because the physical-address holding memory cell circuit 41 can easily be accessed, it is possible to easily write data in the circuit 41 or test it.

Because the operation for storing data in the memory cell circuit 41 of the physical-address holding CAM circuit 3 is the same as that of the CAM circuit according to the prior art, it is only necessary to write data in the memory cell of the word selected by the word selection signal.

The operation for comparing the physical address data stored in the physical-address holding CAM circuit 3 with cache tag data is also the same as that of the existing CAM circuit. The physical-address holding CAM circuit 3 checks if the physical address data stored in the memory cell circuit 41 of the physical-address holding CAM circuit 3 coincides with the cache tag data read to the bit lines 9 and 10 from the cache tag. If not, both transistors of either of the n-channel transistor pairs 33e and 33g on one hand and 33f and 33h on the other in the memory cell circuit 41 of the physical-address holding CAM circuit 3 are turned on. Then, the hit signal 6 (coincidence signal) in FIG. 4 has the logical value "0" because it is connected with the earth potential. This is the same as the case of a normal CAM circuit.

When the former coincides with the latter, however, the operation is slightly different from the above operation. For the normal CAM circuit, the hit signal 6 in FIG. 4 is not connected with the earth potential when the both pieces of data coincide with each other. For the physical-address holding CAM circuit 3, however, the n-channel transistor 43 is turned on, the hit signal 6 (coincidence signal) is connected with the earth potential, and the logical value comes to "0" when the hit signal 5 of the virtual-address CAM circuit 2 is "0" (that is, when no virtual address is hit). Therefore, the hit signal 6 of the physical-address holding CAM circuit 3 has the logical value "1" when "the data in the physical-address holding CAM circuit 3 coincides with external data" and "the hit signal 5 of the same address of the virtual-address CAM circuit 2 is "1"".

In other words, the hit signal 6 of the physical-address holding CAM circuit 3 has the logical value "1" when "a virtual address is present in the virtual-address CAM circuit 2" and "a physical address converted by the present virtual address coincides with cache tag data in the physical-address CAM circuit 3". This is the same as the case in which the memory control system of the embodiment according to the prior art uses a normal TLB and cache memory. The operation of this embodiment is described below in detail. <1> In FIG. 1, data coinciding with the virtual address 4 is searched in the virtual-address holding CAM circuit 2. <2> At the same time as the operation in the above Item <1>, the data in cache tag is read out to the bit lines 9 and 10 by using the virtual address 4 as an address. <3> It is checked by the physical-address holding CAM circuit 3 if the data read out to the bit lines 9 and 10 coincides with physical address data. Similarly to a normal CAM circuit, data values in all words are simultaneously compared in the physical-address holding CAM circuit 3. <4> While data is checked by the physical-address holding CAM circuit 3, the result of judgment on coincidence by the virtual-address holding CAM circuit 2 is prepared. If coincident data is present in the virtual-address holding CAM circuit 2, any one of the hit signals 5 connected to the words of the virtual-address holding CAM circuit 2 has the value "1". <5> When "the data in the bit lines 9 and 10 coincides with any word of physical address data in the physical-address holding CAM circuit 3" and "a virtual address is present in the same word in the virtual-address holding CAM circuit 2", the hit signal 6 has the value "1" because all routes connecting the supply potential 31 with the earth potential in FIG. 4 are cut off. And, the hit signal 6 generates the final hit signal 8 through the OR circuit 7 in FIG. 1. The final hit signal 8 comes to "1" only when virtual address data converted into physical address data coincides with tag data. <6> When the conditions in the above Item <5> are not met, that is, when "no data value in the bit lines 9 and 10 coincides with any physical address data value", "no virtual address data is present in TLB", or "though the data in the bit lines 9 and 10 coincides with any word of physical address data and virtual address data is present in any word in TLB, these words do not coincide with each other", the final bit signal 8 has the value "0" because there is a route for transferring the electric charge of the supply potential 31 to the earth potential.

Figures 5A, 5B:
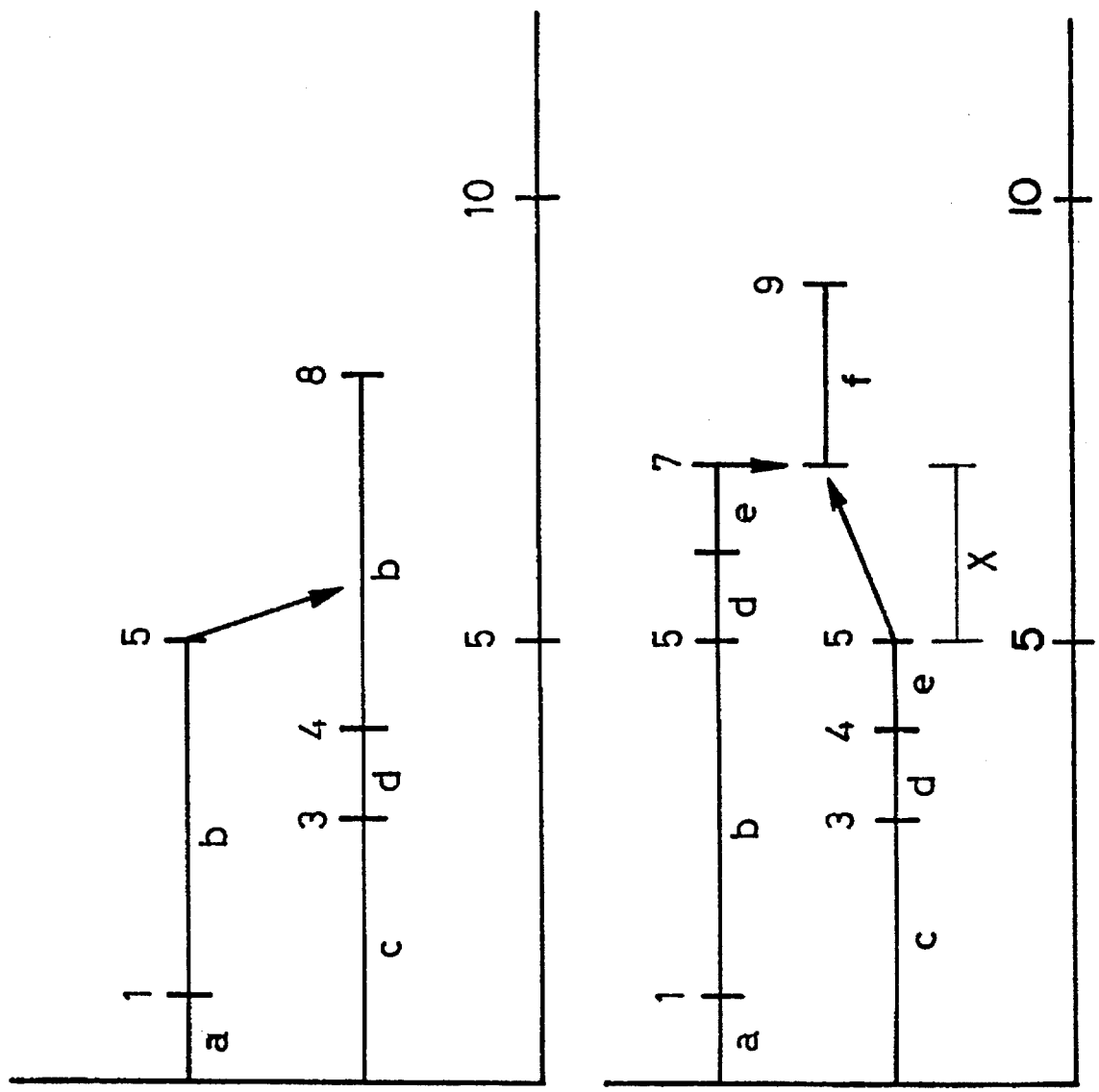
FIG. 5(*a*) is a diagram showing the time lag necessary for hit judgment on cache data in the associative memory of the current invention.

FIGS. 5(a) and 5(b) are graphs showing the address conversion time required by the present invention and that required by an embodiment according to the prior art. In FIGS. 5(a) and (b), the axis of abscissas represents time. FIG. 5(a) shows the address conversion time required by the present invention and FIG. 5 (b) shows that required by the embodiment according to the prior art. Various processing times necessary for an associative memory system are assumed as shown below. a: Time for generating reverse data from addresses, 1 b: Time for CAM circuit to generate hit signal, 4 c: Time for memory circuit to perform decoding, 3 d: Time in which cell data in memory circuit is read out to bit line, 1 e: Time for sense amplifier to determine data in memory circuit, 1 f: Time for comparison circuit to compare data and generate hit signal, 2 Because the above numerals 1 to 4 represent relative values, they do not have any unit.

In FIG. 5(a), the top stage shows the time required by the virtual-address holding CAM circuit 2 of a TLB circuit and the bottoms rage shows the time required by the cache tag and the time required by the physical-address holding CAM circuit 3 of the present invention. In FIG. 5(b), the top stage shows the time required by a normal TLB circuit, the bottom stage shows the time required by the cache tag, and the middle stage shows the time required by a comparator. The associative memory system of the present invention generates the final hit signal more quickly at the ratio of 8:9.

The CAM circuit normally requires a long time to generate a hit signal. Therefore, after the embodiment according to the prior art reads data from the cache tag, an idle time X in which the data is not used is produced. For the present invention, however, no idle time is produced and the final hit signal can be generated faster than the embodiment according to the prior art because two CAM circuits are constituted so as to execute processings at the same time in parallel though the present invention uses the CAM circuit twice. Therefore, hit judgment on cache data can be accelerated.

Moreover, because it is possible to use the CAM circuit in the existing TLB circuit as a circuit to be added, the design efficiency is greatly improved. Further more, to realize the circuit with LSI, design is easily and inexpensively made and a very large effect for practical use is obtained because the circuit can be constituted by repeatedly using a unit circuit.

In addition, the TLB circuit can easily be tested because a word selection line of the physical-address holding CAM circuit 3 in the TLB circuit can be selected independently of the virtual-address CAM circuit 2.

The above mentioned is detailed description of the operation of the associative memory system of the present invention.

The constitution of the system, in other words, is provided with a CAM circuit 2 for outputting a hit signal 5 when a supplied address 72 for specifying a memory area, that is, the data (virtual address) previously stored in a memory cell circuit 41 selected by a word selection signal 35 coincides with a virtual address 4, a cache-tag memory circuit 1 for outputting cache tag data when the cache data coinciding with the virtual address 4 is present, and a CAM circuit 3 connecting with a hit signal line to output the hit signal 5 given from the CAM circuit 2 and outputting the hit signal 5 when a memory area from which the hit signal 5 is outputted or a physical address previously stored in a word coincides with the cache tag data supplied from the cache-tag memory circuit 1.

EMBODIMENT 2

Another embodiment of the present invention is described below by referring to the drawings.

FIG. 6 shows another form of the associative memory system using the associative memory of the present invention. A system using a cache memory frequently uses two faces of cache tag. In this case, the cache is called two-way cache.

In FIG. 6, because two caches are used; a cache-tag memory circuit 1, physical-address holding CAM circuit 3, virtual-address hit signal 5, signal 6 for checking if a physical address coincides with a cache tag, OR circuit 7, and hit signal 8 for indicating that the virtual address is entered in the cache are paired respectively. Moreover, an OR circuit 7c is added to generate a final hit signal 11 from hit signals 8a and 8b indicating that two virtual addresses are entered in the cache.

The following is the brief description of the operation of the embodiment 2. Equal data is stored in equal words of two physical-address holding CAM circuits 3a and 3b. Different tag data is stored in equal words of two cache-tag memory circuits 1a and 1b. The operation of the embodiment 2 is completely the same as that of the embodiment 1. However, because different tag data is stored in equal words of two cache-tag memory circuits 1a and 1b, either or neither of the signals 6a and 6b for checking if a physical address coincides with a cache tag are hit.

Therefore, the final hit signal comes to "1" only when either of the signals 6a and 6b for checking if a physical address coincides with a cache tag is hit. By using the above constitution, the hit rate for one virtual address data value is doubled. The same constitution can also be applied to 4-way and 8-way cache memories.

EMBODIMENT 3

Figure 7:
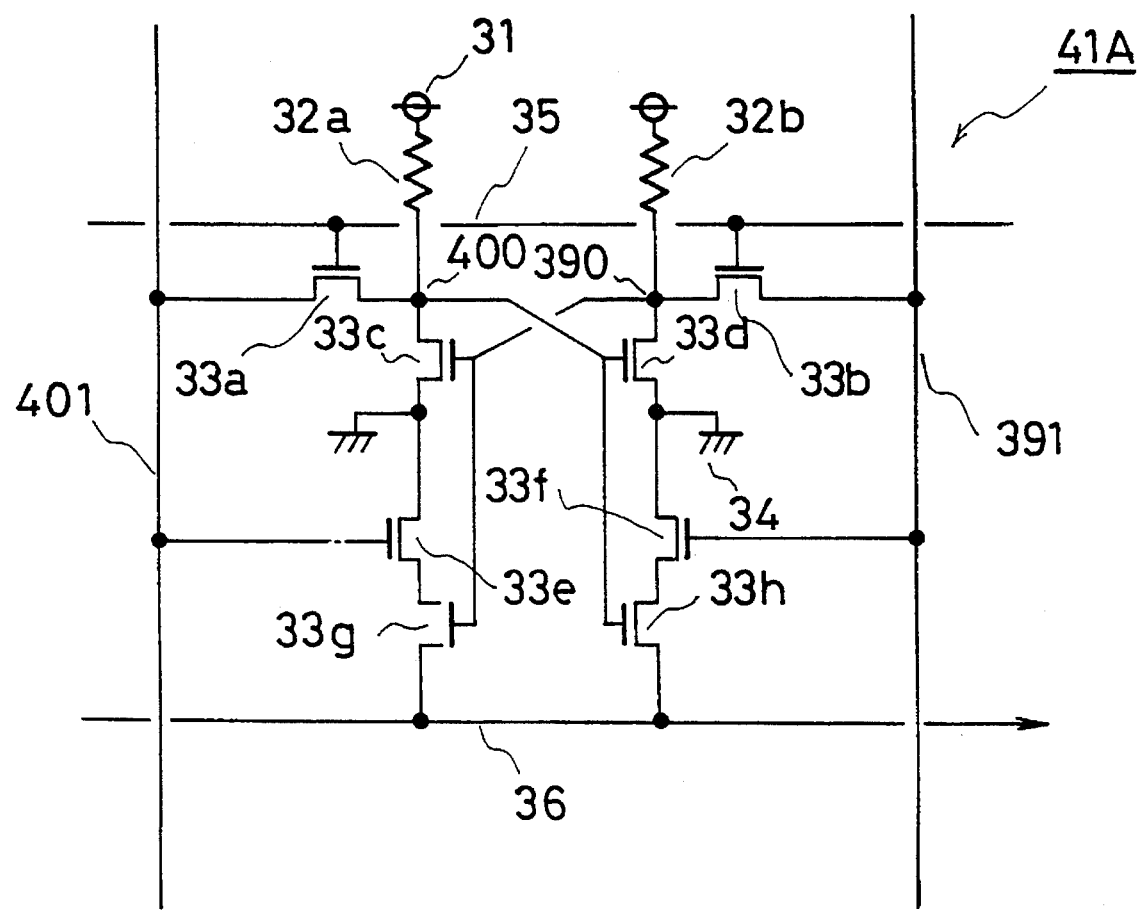
FIG. 7 is an internal detailed block diagram of the CAM cell circuit of another embodiment of the present invention.
Figure 8:
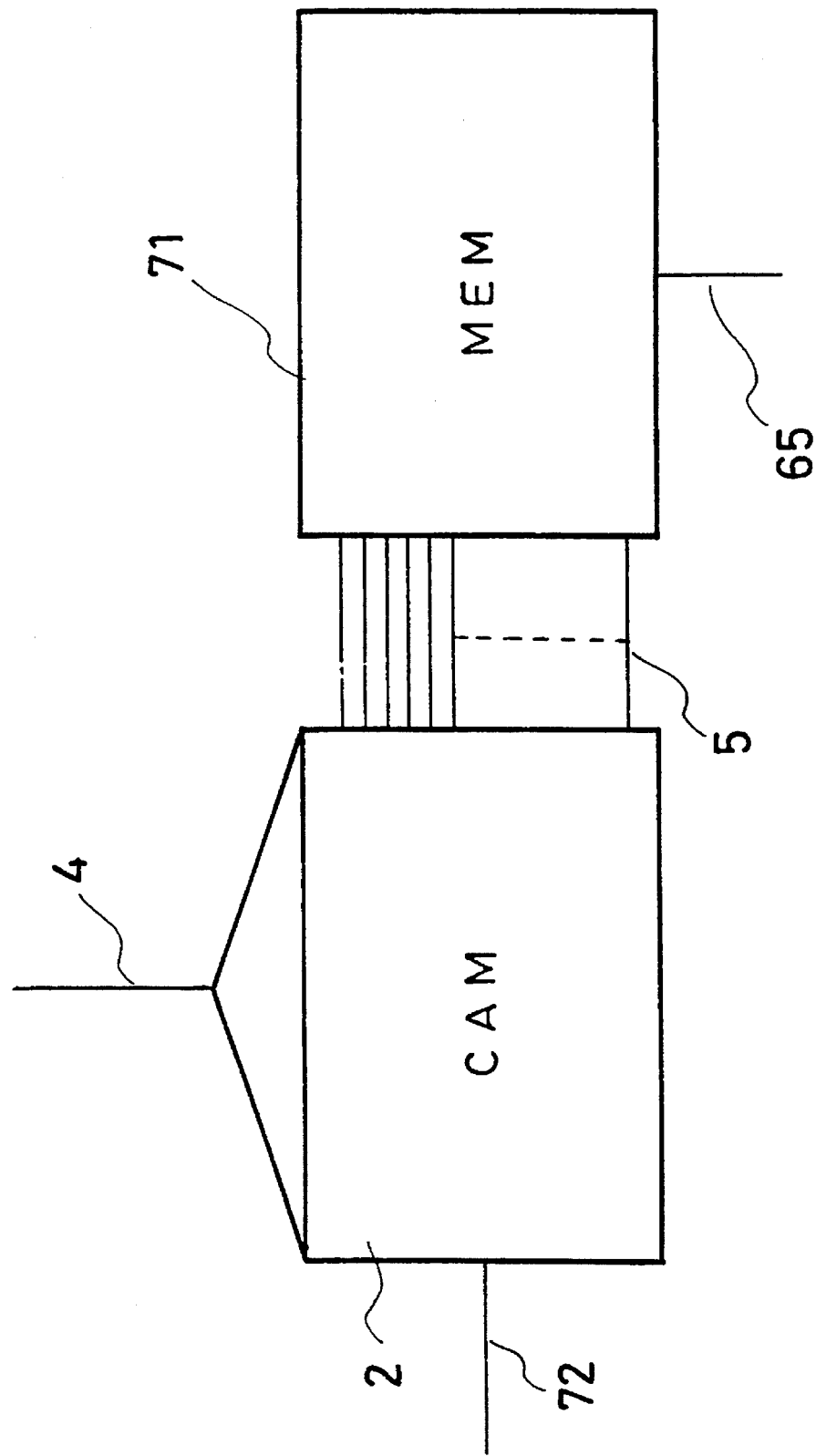
FIG. 8 is a block diagram of an existing TLB circuit.
Figure 9:
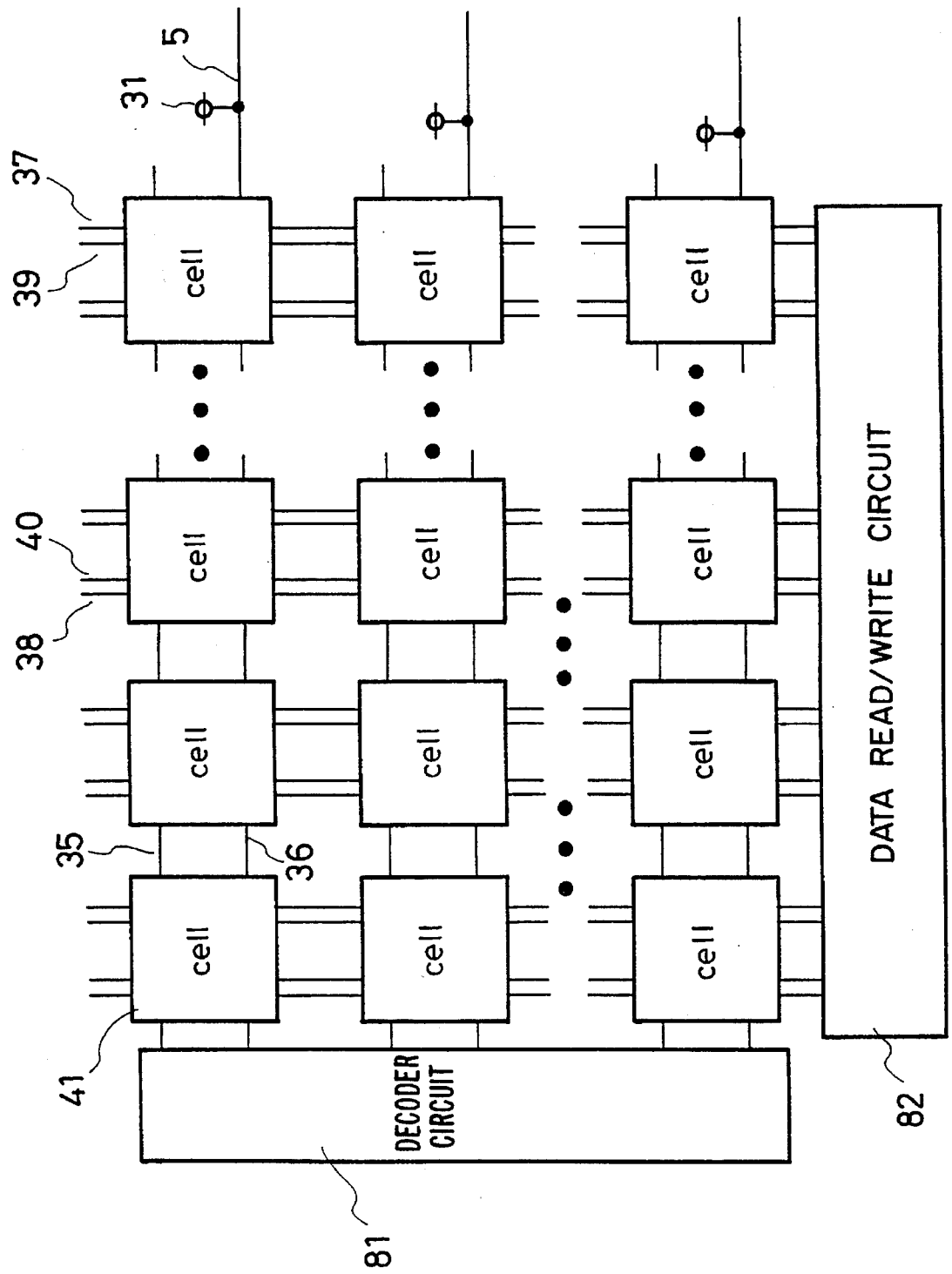
FIG. 9 is a block diagram of an existing CAM circuit.
Figure 10:
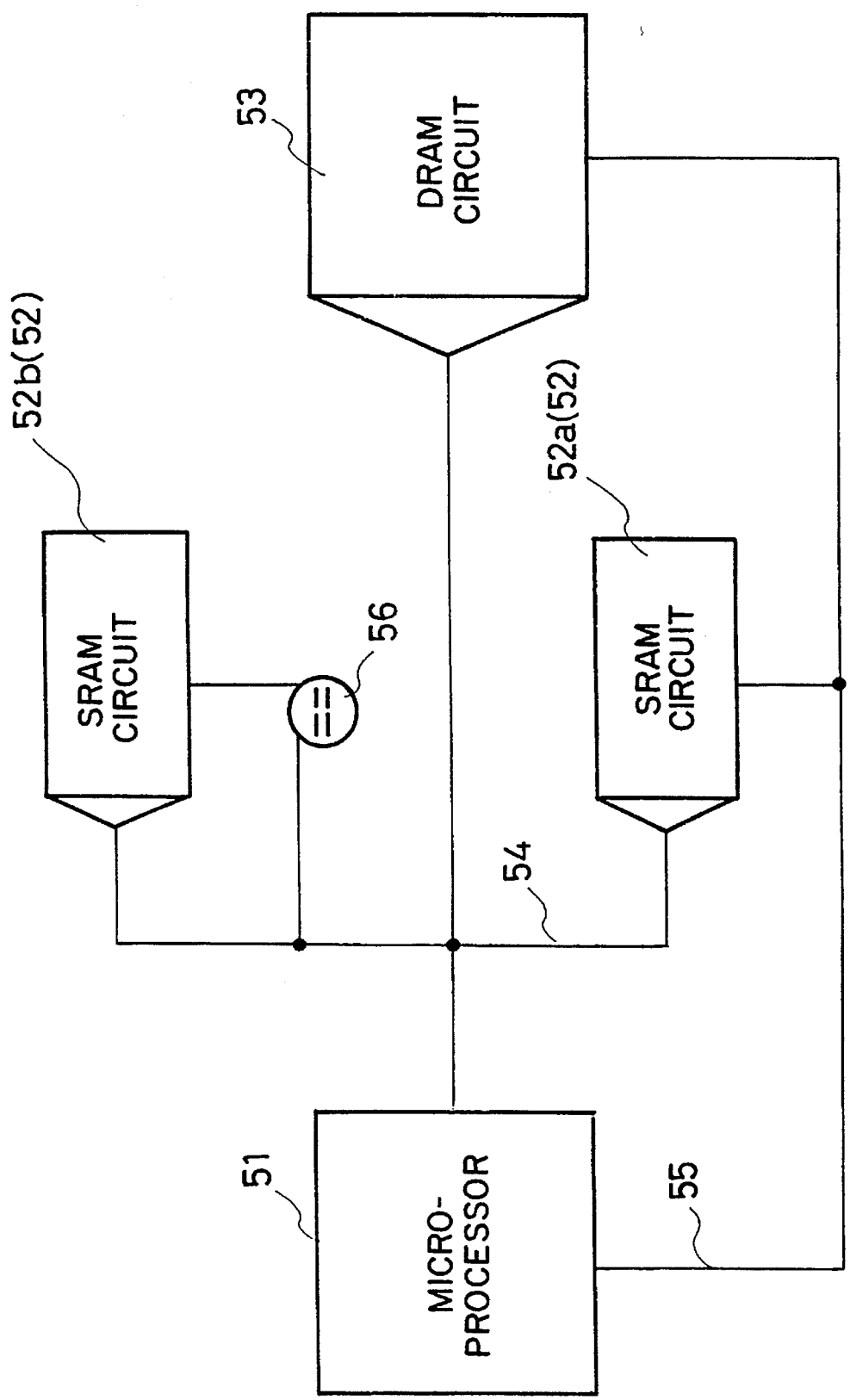
FIG. 10 is a block diagram of an existing associative memory system using cache memory.
Figure 11:
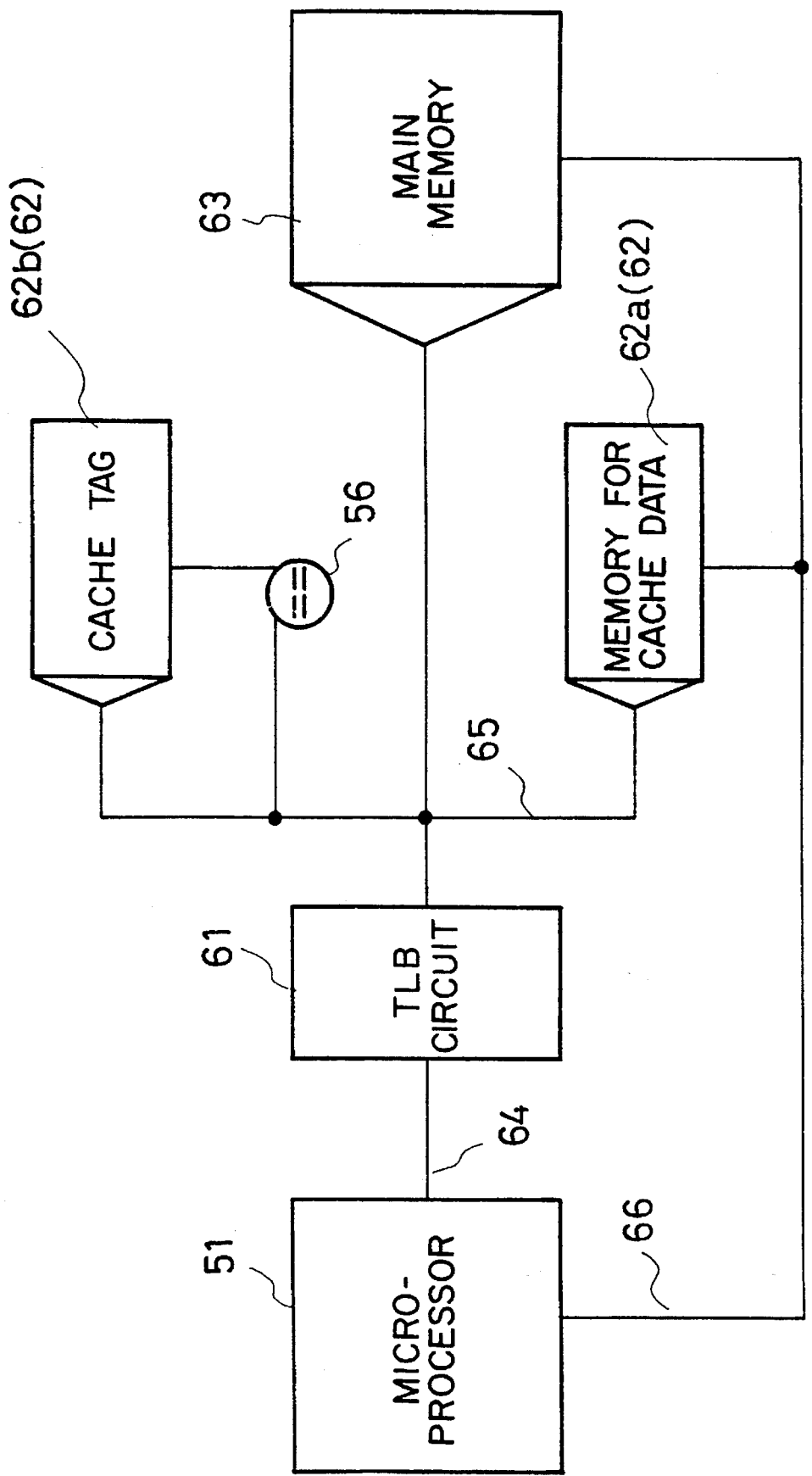
FIG. 11 is a block diagram of an associative memory system using an existing TLB circuit and cache memory.
Figure 12:
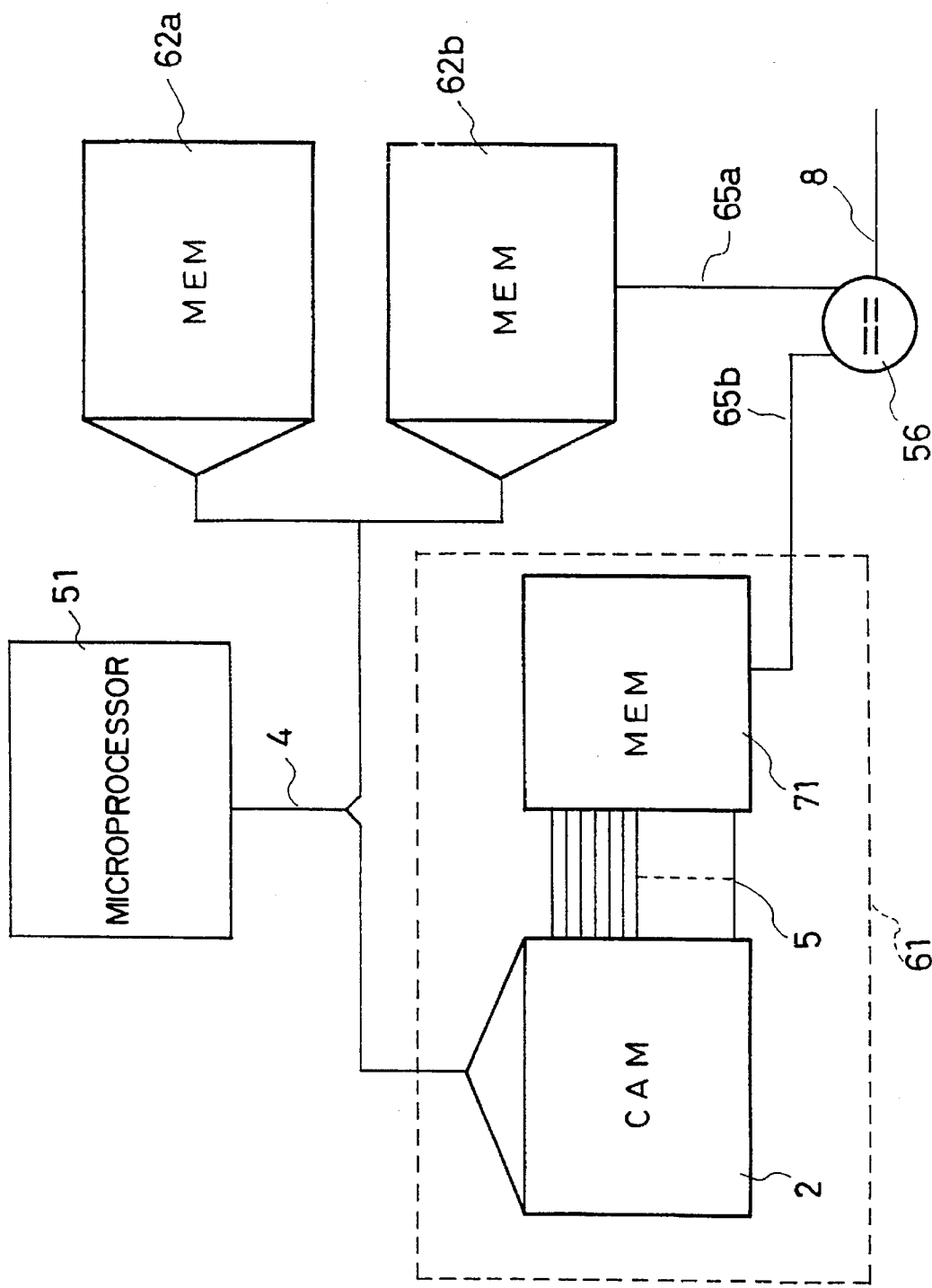
FIG. 12 is a block diagram of an existing associative memory system.

An embodiment of the associative memory system according to claim 2 of the present invention is described below by referring to the drawings. FIG. 7 shows another form of the memory cell circuit of the associative memory system according to the present invention. The memory cell circuit 41A has a common bit line shared by the bit line 37 for external data to be compared and the bit line 39 for stored data and a common reverse bit line shared by the bit line 38 for reverse data of the external data to be compared and the bit line 40 for reverse data of the stored data in the CAM cell circuit 41 in FIG. 3. In FIG. 7, numeral 391 is the common bit line and 401 is the common reverse bit line.

For example, the memory circuit 1 and the CAM circuit 3 of the embodiment 1 comprise the above memory cell circuit (CAM cell circuit) 41A. That is, the common bit lines 309 of the memory circuit 1 and CAM circuit 3 and the common reverse bit lines 401 of them are respectively connected with each other. The operation is completely the same as that of the embodiment 1. Data is written in the CAM cell circuit comprising the memory cell circuit 41A in the same way as that of the embodiment i by using the bit lines 391 and 401 as the bit lines 39 and 40 for stored data. Data values are compared in the same way as that of the embodiment 1 by using the bit lines 391 and 401 as the bit lines 37 and 39 for external data to be compared.

When the CAM cell circuit 41 and the memory circuit 1 are constituted with the memory cell circuit 41 in FIG. 7, not only the effect by the embodiment 1 is obtained but the same data can simultaneously be written in the CAM cell circuit 3 and cache tag memory circuit 1 because the bit line of the CAM cell circuit 3 and the cache tag memory circuit 1 is shared. Unless the data in the CAM cell circuit 3 or cache tag 1 hits the TLB circuit or cache circuit, it must be rewritten. In this case, the same data is written. Though data in the TLB circuit and cache circuit has separately been rewritten so far, the constitution in FIG. 7 makes it possible to rewrite data at the same time.

As described above, the present invention makes it possible to execute hit judgment on cache data at a high speed and write the same data in a cache memory and associative memory circuit connected through common-bit and common-reverse-bit lines in an associative memory system using an associative memory.

What is claimed is:

1. An associative memory system, comprising:

a first associative memory for storing a plurality of virtual addresses, said first associative memory including a first plurality of output lines, one corresponding to each stored virtual address, said first associative memory asserting a first hit signal on a particular one output line of said first plurality of output lines that corresponds to a particular one virtual address of said plurality of virtual addresses when an input virtual address matches said particular one virtual address;

a cache memory for outputting a physical address tag at an output of said cache memory responsive to an input of said input virtual address; and a second associative memory, coupled to said first plurality of output lines and to said output of said cache memory, for storing a plurality of physical addresses that correspond respectively to said plurality of virtual addresses, said second associative memory including a second plurality of output lines, one corresponding to each stored physical address, said second associative memory asserting a second hit signal on a particular one output line of said second plurality of output lines that corresponds to a particular one physical address of said plurality of physical addresses when both said physical address tag matches said particular one physical address and said first hit signal from said respective corresponding particular one virtual address is asserted.

2. An associative memory system according to claim 7, wherein each of said first and second associative memories and said cache memory store an address represented by a plurality of bit positions, each of said memories comprising:

an array of a plurality of memory cells, each memory cell for storing a bit value and a complementary bit value for a particular bit position of the plurality of bit positions of the address;

a plurality of common bit lines, each common bit line coupling said bit values of said plurality of memory cells that correspond to each said particular bit position of the plurality of bit positions; and a plurality of complementary common bit lines, each complementary common bit line coupling said complementary bit values of said plurality of memory cells that correspond to each said particular bit position of the plurality of bit positions, wherein said common bit lines of said cache memory and said second associative memory corresponding to each said particular bit position are coupled together, and said complementary common bit lines of said cache memory and said second associative memory corresponding to each said particular bit position are coupled together.

3. An associative memory system according to claim 1 or 2, wherein said cache memory and said second associative memory comprise a plurality of independent circuits, with a number of said plurality of independent cache memory circuits equaling a number of said plurality of independent second associative memory circuits.

4. An associative memory system according to claim 1 wherein said first associative memory and said second associative memory each comprise a content-addressable memory circuit.

5. An associative memory system according to claim 1 further comprising a logical-sum gate circuit, coupled to said second plurality of output lines, for asserting a final hit signal when a second hit signal is asserted on any one of said second plurality of output lines.

6. An associative memory system according to claim 1 wherein each of said first plurality of output lines is coupled to its corresponding one output line of said second plurality of output lines through an inverter circuit coupled to a gate of an n-channel transistor having a terminal coupled to said corresponding one output line of said second plurality of output lines.

7. A method for determining whether a supplied virtual address is stored in a cache, comprising the steps of:

inputting the supplied virtual address to both a first associative memory and to a cache tag memory, said first associative memory storing a plurality of virtual addresses and said cache tag memory storing a plurality of tag addresses;

asserting a first hit signal from said first associative memory at a particular one of a plurality of first output lines of said first associative memory when the supplied virtual address matches one of said plurality of stored virtual addresses, each said output line of said plurality of first output lines corresponding to a stored virtual address;

outputting a particular tag address from said cache tag memory responsive to the supplied virtual address; and asserting a second hit signal, responsive to said first hit signal and to said particular tag address, from a second associative memory at a particular one of a plurality of second output lines, said second associative memory storing a plurality of physical addresses corresponding to said plurality of stored virtual addresses, said second hit signal asserted when both said particular tag address matches a particular one of said stored physical addresses and said first associative memory asserts said first hit signal that corresponds to said stored virtual address that corresponds to said particular one stored physical address.

8. The method of claim 7 further comprising the step of searching said second associative memory for a match of said tag address while searching said first associative memory for a match of the supplied virtual address.

* * * * *